(12) United States Patent
Park

(10) Patent No.: US 11,379,378 B2
(45) Date of Patent: *Jul. 5, 2022

(54) APPARATUS AND METHOD FOR IMPROVING INPUT AND OUTPUT THROUGHPUT OF MEMORY SYSTEM

(71) Applicant: SK hynix Inc., Gyeonggi-do (KR)

(72) Inventor: Jeen Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 81 days.

This patent is subject to a terminal disclaimer.

(21) Appl. No.: 16/921,508

(22) Filed: Jul. 6, 2020

(65) Prior Publication Data

US 2021/0200688 A1 Jul. 1, 2021

(30) Foreign Application Priority Data

Dec. 30, 2019 (KR) .................. 10-2019-0178138

(51) Int. Cl.
| | |
|---|---|
| *G06F 9/26* | (2006.01) |
| *G06F 12/1045* | (2016.01) |
| *G06F 12/06* | (2006.01) |
| *G11C 7/10* | (2006.01) |

(52) U.S. Cl.
CPC ...... *G06F 12/1063* (2013.01); *G06F 12/0607* (2013.01); *G11C 7/1042* (2013.01); *G11C 7/1057* (2013.01); *G11C 7/1084* (2013.01); *G06F 2212/7201* (2013.01)

(58) Field of Classification Search
CPC ............ G06F 12/1063; G06F 12/0607; G06F 2212/7201; G11C 7/1042; G11C 7/1057; G11C 7/1084
USPC ........................................................ 711/202
See application file for complete search history.

(56) References Cited

U.S. PATENT DOCUMENTS

| | | |
|---|---|---|
| 8,239,589 B1 | 8/2012 | Certain et al. |
| 9,229,854 B1 | 1/2016 | Kuzmin et al. |
| 9,432,298 B1 | 8/2016 | Smith |
| 2019/0227940 A1* | 7/2019 | Kim ................ G06F 12/0873 |

* cited by examiner

*Primary Examiner* — Huan Hoang
(74) *Attorney, Agent, or Firm* — IP & T Group LLP

(57) ABSTRACT

A memory system includes a plurality of memory dies configured to store data; and a controller coupled with the plurality of memory dies through a plurality of channels, wherein the controller decides whether to perform a pairing operation, by comparing the number of pieces of read data to be outputted to an external device, which are included in a first buffer, with an output count reference value, and wherein, in the case where the number of pieces of read data stored in the first buffer is greater than or equal to the output count reference value, the controller gathers other read requests and logical addresses corresponding thereto in a second buffer, and performs the pairing operation.

20 Claims, 9 Drawing Sheets

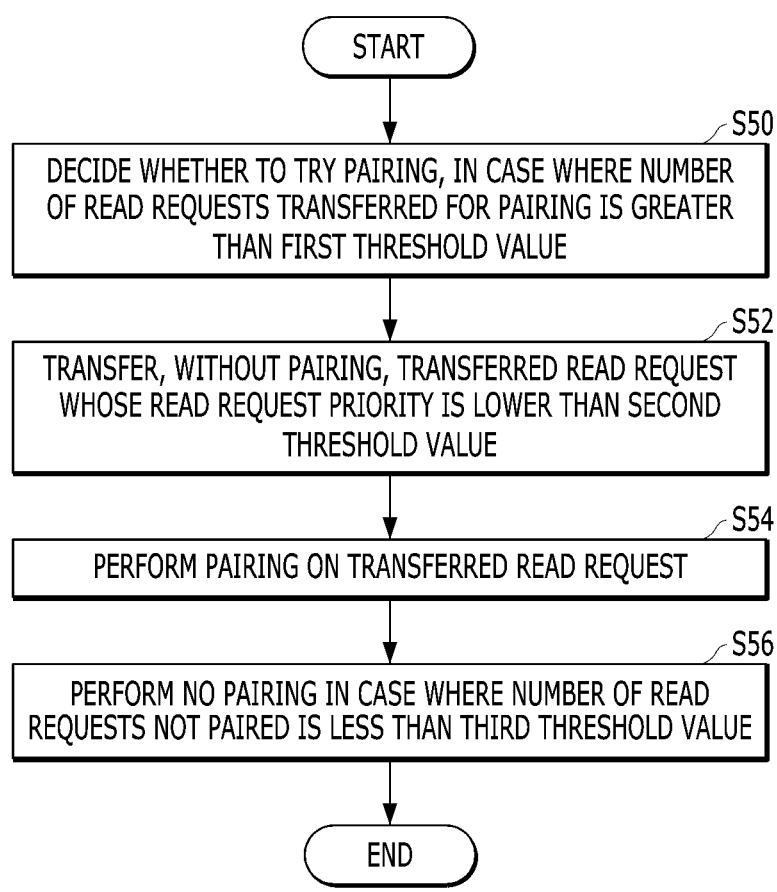

APPARATUS AND METHOD FOR IMPROVING INPUT AND OUTPUT THROUGHPUT OF MEMORY SYSTEM

CROSS-REFERENCE TO RELATED APPLICATION

This application claims priority under 35 U.S.C. § 119 to Korean Patent Application No. 10-2019-0178138, filed on Dec. 30, 2019, which is incorporated herein by reference in its entirety.

BACKGROUND

1. Field

Embodiments relate to a memory system, and more particularly, to an apparatus and method for improving input and output throughput of a memory system through an interleaving operation on a plurality of memory dies in the memory system.

2. Discussion of the Related Art

Recently, the paradigm for the computing environment has changed to ubiquitous computing in which computer systems can be used anytime anywhere. Therefore, the use of portable electronic devices such as mobile phones, digital cameras and notebook computers has rapidly increased. Such portable electronic devices generally use a memory system using a memory device, that is, a data storage device. The data storage device is used as a main or secondary memory device of the portable electronic device.

Since the data storage device using a nonvolatile memory device has no mechanical driver, unlike a hard disk, the data storage device has excellent stability and durability, high information access speed, and low power consumption. As examples of memory systems having such advantages, the data storage device includes a universal serial bus (USB) memory device, a memory card having various interfaces, a solid state drive (SSD) and the like.

SUMMARY

Various embodiments are directed to a memory system, a data processing system and an operating method thereof capable of minimizing the complexity and performance degradation of the memory system and maximizing the use efficiency of a memory device, thereby quickly and stably processing data with respect to the memory device.

Also, various embodiments are directed to an apparatus and method capable of improving input and output (I/O) throughput of a memory system by inputting and outputting data to and from a plurality of memory dies in the memory system through an interleaving operation.

Further, various embodiments are directed to an apparatus and method capable of improving the stability of an operation and the lifetime of a memory system by efficiently utilizing a plurality of memory dies in the memory system, even without limiting physical locations where data are to be stored, for an interleaving operation, in the process of storing data in the plurality of memory dies.

Moreover, various embodiments are directed to an apparatus and method capable of dynamically deciding whether to perform or stop a paring operation, in correspondence to the configuration of a memory system, a margin for an internal operation of the memory system and the characteristics of the pairing operation, when performing a data read/write operation in the memory system, thereby reducing an unnecessary overhead.

In addition, various embodiments are directed to an apparatus and method capable of increasing the operation efficiency of a memory system through an address allocation structure in which data may be outputted from a plurality of memory dies in the memory system through an interleaving operation while reducing resources used in a pairing operation.

It is to be understood that technical objects to be achieved by the disclosure are not limited to the aforementioned technical objects and other technical objects which are not mentioned herein will be apparent from the following description to one of ordinary skill in the art to which the disclosure pertains.

The disclosure provides a memory system, a data processing system, an operating method thereof, and a method for checking an operation.

The afore-described aspects of the disclosure are merely a part of embodiments of the disclosure. Those skilled in the art will derive and understand various embodiments reflecting the technical features of the disclosure from the following detailed description of the disclosure.

Effects of the apparatus according to the embodiments of the disclosure are as follows.

According to the embodiments of the disclosure, a memory system, a data processing system, an operating method thereof and a method for checking an operation may reduce an overhead in the memory system for an interleaving operation while eliminating or reducing an address limitation on physical locations in the memory system for the interleaving operation.

Also, according to the embodiments of the disclosure, by reducing the address limitation on physical locations in the memory system for the interleaving operation while improving the input/output throughput of the memory system through the interleaving operation, advantages may be provided in that it is possible to improve the efficiency and lifetime of a memory device.

Further, according to the embodiments of the disclosure, since a controller in the memory system may predict an operation margin for performing a pairing operation and may perform the pairing operation within the predicted operation margin, advantages may be provided in that it is possible to input and output data through the interleaving operation while avoiding an overhead in the memory system, thereby improving the throughput of the memory system.

Effects obtainable from the disclosure may be non-limited by the above mentioned effects. Other effects may be clearly understood from the following description by those having ordinary skill in the technical field to which the disclosure pertains.

In an embodiment, a memory system includes a plurality of memory dies configured to store data; and a controller coupled with the plurality of memory dies through a plurality of channels, wherein the controller decides whether to perform a pairing operation, by comparing the number of pieces of read data to be outputted to an external device, which are included in a first buffer, with an output count reference value, and wherein, in the case where the number of pieces of read data stored in the first buffer is greater than or equal to the output count reference value, the controller gathers other read requests and logical addresses corresponding thereto in a second buffer, and performs the pairing operation.

In an embodiment, performing a pairing operation on at least some among a plurality of read requests, the method comprising: receiving a plurality of read requests from an external device, and storing the plurality of read requests in an input buffer; checking the number of pieces of read data to be outputted to the external device, which is stored in an output buffer, to decide whether to perform the pairing operation on the plurality of read requests; deciding whether to perform the pairing operation on the plurality of read requests, in correspondence to the number of pieces of read data; performing the pairing operation in correspondence to logical addresses transferred together with the plurality of read requests; transferring paired read requests to the plurality of memory dies through a plurality of channels, by performing address translation thereon; receiving data for the paired read requests in an interleaving scheme through the plurality of channels; and outputting received data to the external device.

In an embodiment, a memory system comprising: a memory device including a plurality of memory dies; and a controller including a buffer coupled to a host, the controller suitable for: receiving a plurality of read requests from the host; deciding whether to perform a pairing operation on the plurality of read requests, based on the number of pieces of read data stored in the buffer; performing the pairing operation on the plurality of read requests to generate paired read requests; and transferring the paired read requests to the plurality of memory dies.

BRIEF DESCRIPTION OF THE DRAWINGS

FIG. 9 is a flow chart illustrating a method for a controller to perform a pairing operation.

DETAILED DESCRIPTION

Figure 1:
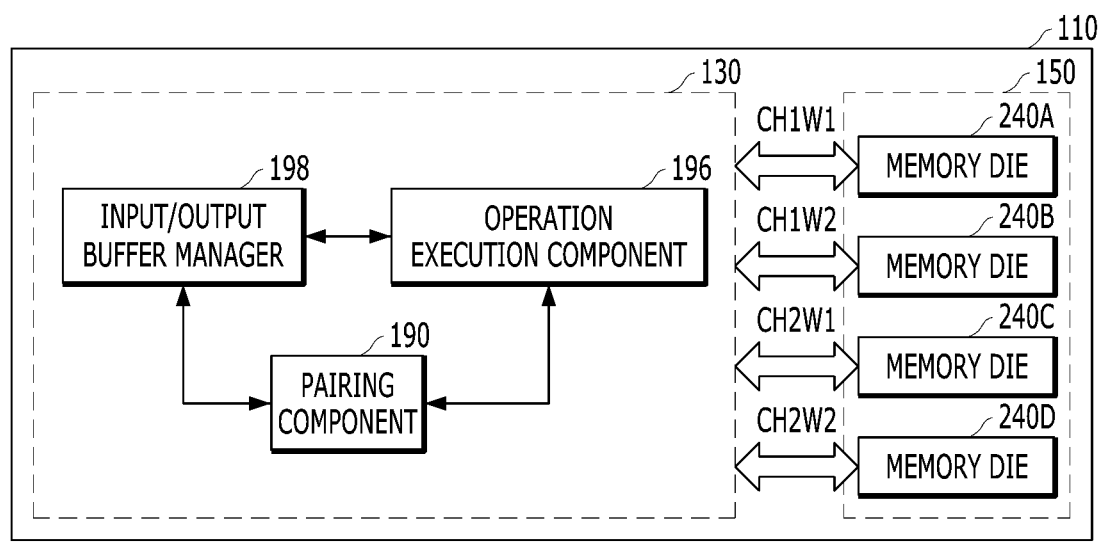
FIG. 1 illustrates a memory system according to an embodiment of the disclosure.

Various embodiments of the present invention are described below in more detail with reference to the accompanying drawings. However, elements and features of the present disclosure may be configured or arranged differently than disclosed herein. Thus, the present invention is not limited to the embodiments set forth herein. Rather, the described embodiments are provided so that this disclosure is thorough and complete and fully conveys the present invention to those skilled in the art to which this invention pertains. Throughout the disclosure, like reference numerals refer to like parts throughout the various figures and embodiments of the present invention. It is noted that reference to "an embodiment," "another embodiment", and the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without indicating any change in the element itself.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via one or more intervening elements. Communication between two elements, whether directly or indirectly connected or coupled, may be wired or wireless, unless stated or the context indicates otherwise.

In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 illustrates a memory system 110 in accordance with an embodiment. For example, the memory system 110 may be mounted in a computing device or mobile device, and be operably coupled with a host 102 (see FIG. 2) to exchange data therewith.

Referring to FIG. 1, the memory system 110 includes a controller 130 and a memory device 150. The controller 130 may control the memory device 150 to output data requested by the host 102, or control the memory device 150 to store data transferred from the host 102 therein. The memory device 150 may include a plurality of blocks each including a plurality of cells capable of storing data therein. The design of the internal configuration of the memory device 150 may be changed according to the characteristics of the memory device 150, the purpose of use of the memory system 110 or the specification of the memory system 110.

The controller 130 and the memory device 150 may be coupled to each other through a plurality of data paths. For example, the memory device 150 may include a plurality of memory dies 240A to 240D. The plurality of memory dies 240A to 240D may be coupled to the controller 130 through different data paths. In the illustrated example, the first memory die 240A and the controller 130 may be coupled through a first channel and first way CH1W1, and the second memory die 240B and the controller 130 may be coupled through a first channel and second way CH1W2. Furthermore, the third memory die 240C and the controller 130 may be coupled through a second channel and first way CH2W1, and the fourth memory die 240D and the controller 130 may be coupled through a second channel and second way CH2W2. The numbers of channels and ways constituting the data paths between the controller 130 and the memory device 150 may be changed according to the number of the memory dies in the memory device 150. The numbers of the channels and ways for coupling the memory dies 240A to 240D to the controller 130 may be changed according to the purpose of use of the memory system 110 or the specification of the memory system 110, requested by the host 102.

The plurality of memory dies 240A to 240D within the memory device 150 may be considered as different modules, and coupled to the controller 130 through different data paths. When the plurality of memory dies 240A to 240D and the controller 130 do not exchange data through one data path, the plurality of memory dies 240A to 240D and the controller 130 may exchange data through an interleaving operation therebetween, thereby increasing a data transfer rate.

For the interleaving operation, data are not stored in one module within the memory device 150, but are distributed and stored in various modules. For this configuration, a conventional memory system has employed a scheme for distributing and storing new data into a plurality of modules within the memory device 150, when storing the new data. For example, when programming four pieces of data, the conventional memory system may store the four pieces of data in four memory dies, respectively.

In order to increase the efficiency of program and read operations, the conventional memory system has employed address limitation as well as distributed storage. In the context of storing four pieces of data, the address limitation refers to an operation of storing the four pieces of data at the same locations of the respective memory dies. For example, the memory system stores the four pieces of data at fifth physical locations of the respective memory dies. Then, when programming eight pieces of data, the memory system stores the eight pieces of data at sixth and seventh physical locations of the respective memory dies. The physical location may be the physical address of a block or page within a memory die.

Suppose that five pieces of data are programmed to the memory system in which the above-described address limitation scheme has been employed. When the five pieces of data are stored in four memory dies, two pieces of data are allocated to one memory die, but only one piece of data may be allocated to each of the other three memory dies. The memory system employing the address limitation scheme cannot subsequently write data, which is to be programmed next time, to the other three memory dies. Therefore, the memory system writes dummy data to the other three memory dies.

The conventional memory system may have low efficiency as a result of using the address limitation scheme for the interleaving operation. Furthermore, since each of the memory dies does not have the same operation state (e.g., healthy, wear or the like) at all times, the memory system needs to internally perform an additional operation (overhead), in order to compensate for the operation state.

In accordance with an embodiment, the memory system 110 does not employ the address limitation scheme, but employs a full sync interleaving scheme capable of supporting an interleaving operation. The full sync interleaving scheme has no address limitation in which the memory system 110 needs to store data at the same locations of the plurality of memory dies 240A to 240D within the memory device 150 when storing the data in the respective memory dies. Depending on the internal operation situations and operation states of the respective memory dies, the controller 130 may distribute the data to be programmed. For example, when one memory die (for example, 240A) among the four memory dies 240A to 240D cannot program data immediately due to an internal operation, the controller 130 may transfer the data to the other three memory dies 240B to 240D, in order to program the data. The controller 130 distributes and transfers data to the plurality of memory dies in order to increase the data transfer efficiency for high program speed, but a strict rule such as the address limitation scheme is not applied. Furthermore, the memory system 110 does not need to program unnecessary dummy data unlike the address limitation scheme.

After programming the data into the memory device 150, the controller 130 may generate or update map information for mapping a logical address corresponding to the data to a physical location (i.e. physical address). The controller 130 may store the generated or updated map information in the memory device 150.

As described above, the memory system 110 does not employ the address limitation scheme. Thus, during a process of reading and outputting data requested by the host or an external device, the memory system 110 cannot expect that an interleaving operation between the controller 130 and the memory device 150 necessarily will be performed. Therefore, the controller 130 may include a pairing component 190 which performs a paring operation for pairing operations such that the interleaving operation is performed during the process of reading the data requested by the host or the external device from the memory device 150.

Referring to FIG. 1, the controller 130 may include an input and output (I/O) buffer manager 198, the pairing operation component 190 and an operation execution component 196.

Figure 6:
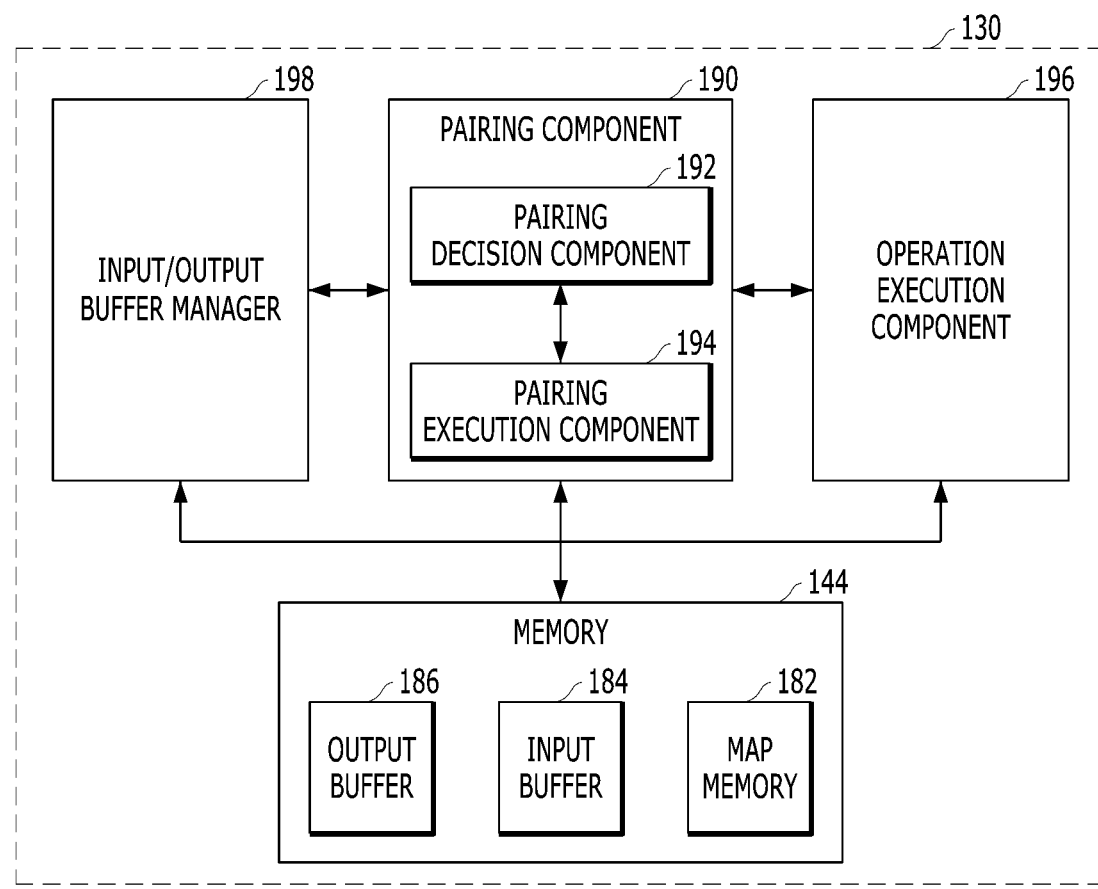
FIG. 6 is a diagram illustrating an internal configuration of a controller in accordance with an embodiment of the disclosure.

The I/O buffer manager 198 may control an input buffer 184 (of FIG. 6) and/or an output buffer 186 (of FIG. 6). The input buffer 184 may serve to temporarily store a command or data requested by the host or the external device. The output buffer 186 may serve to temporarily store data corresponding to the command of the host.

For example, when the host transfers read requests or read commands for data corresponding to 20 logical addresses to the memory system 110, the controller 130 may receive the data for the corresponding logical addresses from the memory device 150, temporarily store the received data in the output buffer 186, and then output the stored data to the host. The I/O buffer manager 198 may recognize how many data to be outputted to the host are stored in the output buffer 186.

The operation execution component 196 may check physical locations within the memory device 150, corresponding to the logical addresses, and then read the data. In response to the logical addresses and the read requests transferred from the input buffer 184, the operation execution component 196 may translate the logical addresses into physical addresses based on the map information, and request data of the corresponding physical addresses from the memory device 150. The physical addresses may indicate specific locations within the plurality of memory dies 240A to 240D of the memory device 150. When the operation execution component 196 performs the read requests according to the order in which the read requests are transferred by the I/O buffer manager 198, the physical addresses may randomly indicate one of the plurality of memory dies 240A to 240D. In this case, an interleaving operation may be performed or not, as explained herein.

When the I/O buffer manager 198 determines that the output buffer 186 has data to be outputted to the host, the logical addresses and the read requests inputted from the host may be transferred to the pairing component 190.

The pairing component 190 may check the map information on the plurality of logical addresses corresponding to the plurality of read requests transferred from the I/O buffer manager 198. Further, the pairing component 190 may perform a pairing operation on the plurality of read requests such that the data which the operation execution component 196 requests from the plurality of memory dies 240A to 240D can be transferred to the controller 130 from the memory device 150 through an interleaving operation. The pairing operation may include an operation of matching the plurality of read requests such that the plurality of read requests are transferred in parallel to the plurality of memory dies through the plurality of channels, and data are outputted in parallel through the plurality of channels from the memory dies coupled to the respective channels. For example, the pairing operation may include an operation of matching read requests related to physical locations where the interleaving operation is possible, among the plurality of read requests. The physical locations where the interleaving operation is possible may include physical locations where data can be transmitted and received through different channels.

Suppose that the host transmits one or read requests for 20 pieces of data stored in the memory system 110. The controller 130 may receive read requests for the 20 pieces of data from the host. The I/O buffer manager 198 may transfer the read requests to the pairing component 190. The pairing component 190 may pair the read requests. For example, when the pairing component 190 checks the physical address of the first data among the 20 pieces of data, the pairing component 190 may recognize that the first data is stored in the first memory die 240A. The pairing component 190 may check the physical address of the second data. When the second data is stored in the third or fourth memory die 240C or 240D, the pairing component 190 can expect an interleaving operation because the second data is transferred through a different channel from the first data. Thus, the pairing component 190 may pair the read requests for the first and second data, and transfer the paired requests to the operation execution component 196.

However, when the second data is stored in the first or second memory die 240A or 240B, the pairing component 190 cannot expect an interleaving operation because the second data is transferred through the same channel as the first data. Therefore, the pairing component 190 does not pair the read requests for the first and second data. The pairing component 190 may check the physical address of the third data. When the third data is stored in the third or fourth memory die 240C or 240D, the pairing component 190 can expect an interleaving operation because the third data is transferred through a different channel from the first data. Thus, the pairing component 190 may pair the read requests for the first and third data, and transfer the paired requests to the operation execution component 196. However, when the third data is stored in the first or second memory die 240A or 240B, the pairing component 190 cannot expect an interleaving operation because the third data is transferred through the same channel as the first or second data. Therefore, the pairing component 190 does not pair the read requests for the first or second data and the third data. The pairing component 190 may check the physical address of the fourth data.

As described above, the pairing component 190 checks the physical locations of data corresponding to read requests, and, when an interleaving operation can be expected, pairs the read requests and transfers the paired requests to the operation execution component 196. For this operation, the pairing component 190 may refer to map information loaded to a memory or buffer which is included in the controller 130 or interconnected to the controller 130.

When the pairing component 190 performs a pairing operation on a plurality of read requests, the pairing operation may have a bad influence on the data I/O throughput of the memory system 110. Therefore, the pairing component 190 may not perform the pairing operation on all read requests transferred from the host. For example, the I/O buffer manager 198 may check data of the output buffer 186, which the memory system 110 will output to the host. Further, the I/O buffer manager 198 may control the pairing component 190 to perform the pairing operation on the read requests, when it is determined that the pairing operation has no influence on the data I/O throughput of the memory system 110 even though the pairing component 190 performs the pairing operation.

The pairing component 190 may not pair all of the plurality of read requests from the I/O buffer manager 198. When an interleaving operation for physical locations of data corresponding to a plurality of read requests is expected, the pairing component 190 may pair the read requests. However, read requests which are not paired by the pairing component 190 but remain may transferred to the operation execution component 196 without a pairing operation.

The controller 130 may pair at least some of the plurality of read requests from the host according to an operation environment, such that data can be transferred between the memory device 150 and the controller 130 through an interleaving operation. Furthermore, the memory system 110 does not need to employ the address limitation scheme in order to transfer data through an interleaving operation. The controller 130 may distribute and store data according to the operation environments and operation states of the plurality of memory dies 240A to 240D within the memory device 150, and try to pair read requests for the plurality of data. Therefore, since the memory system 110 does not employ the address limitation scheme, the plurality of memory dies 240A to 240D can be operated more efficiently, and lifespans of the plurality of memory dies 240A to 240D can be improved. On the other hand, since data can be transferred between the plurality of memory dies 240A to 240D and the controller 130 through an interleaving operation, the degradation in data I/O throughput of the memory system 110 can be prevented.

Figure 2:
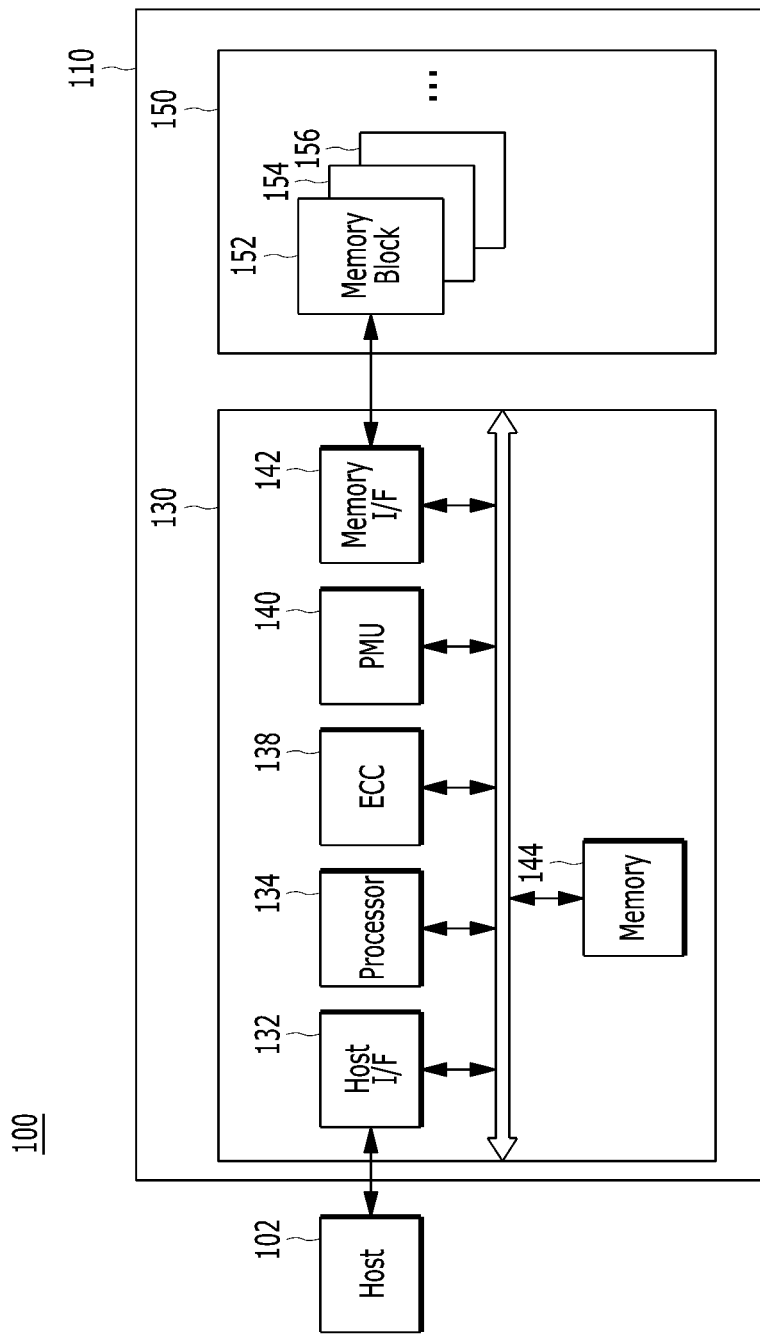
FIG. 2 illustrates a data processing system including a memory system according to an embodiment of the disclosure.

FIG. 2 illustrates a data processing system 100 including a memory system according to an embodiment of the disclosure. Referring to FIG. 2, the data processing system 100 may include a host 102 engaged or operably coupled with a memory system 110.

The host 102 may include, for example, any of a variety of portable electronic devices, such as a mobile phone, an MP3 player and a laptop computer, or an electronic device such as a desktop computer, a game player, a television (TV), a projector and the like.

The host 102 also includes at least one operating system (OS), which can generally manage, and control, functions and operations performed in the host 102. The OS may provide interoperability between the host 102 engaged with the memory system 110 and the user of the memory system 110. The OS may support functions and operations corresponding to user's requests. By way of example but not limitation, the OS may include a general operating system and a mobile operating system according to mobility of the host 102. The general operating system may be split into a personal operating system and an enterprise operating system according to system requirements or user's environment. The personal operating system, including Windows and Chrome, may be subject to support services for general purposes. The enterprise operating systems may be specialized for securing and supporting high performance, including Windows servers, Linux and Unix. Further, the mobile operating system may include an Android, an iOS and a Windows mobile. The mobile operating system may be subject to support services or functions for mobility (e.g., a power saving function). The host 102 may include a plurality of operating systems. The host 102 may execute multiple operating systems in cooperation with the memory system 110, corresponding to a user's request. The host 102 may transmit a plurality of commands corresponding to the user's requests into the memory system 110, thereby performing operations corresponding to commands within the memory system 110. Handling plural commands in the memory system 110 is described below with reference to FIGS. 4 and 5.

The memory system 110 may perform a specific function or operation in response to a request from the host 102 and, particularly, may store data to be accessed by the host 102. The memory system 110 may be used as a main memory system or an auxiliary memory system of the host 102. The memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card and a memory stick.

The storage devices for the memory system 110 may be implemented with a volatile memory device, for example, a dynamic random access memory (DRAM) or a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) or a flash memory.

The memory system 110 may include a controller 130 and a memory device 150. The memory device 150 may store data to be accessed by the host 102. The controller 130 may control storage of data in the memory device 150.

The controller 130 and the memory device 150 may be integrated into a single semiconductor device, which may be included in any of the various types of memory systems as exemplified above.

By way of example but not limitation, the controller 130 and the memory device 150 may be integrated into a single semiconductor device. The controller 130 and memory device 150 may be so integrated to form an SSD for improving operation speed. When the memory system 110 is used as an SSD, the operating speed of the host 102 connected to the memory system 110 can be improved more than that of the host 102 connected with a hard disk. In another embodiment, the controller 130 and the memory device 150 may be integrated into one semiconductor device to form a memory card, such as a PC card (PCMCIA), a compact flash card (CF), a smart media card (e.g., SM, SMC), a memory stick, a multimedia card (e.g., MMC, RS-MMC, MMCmicro), a secure digital (SD) card (e.g., SD, miniSD, microSD, SDHC), or a universal flash memory.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while electrical power is not supplied. The memory device 150 may store data provided from the host 102 through a write operation, while providing data stored therein to the host 102 through a read operation. The memory device 150 may include a plurality of memory blocks 152, 154, 156, each of which may include a plurality of pages. Each of the plurality of pages may include a plurality of memory cells to which a plurality of word lines (WL) are electrically coupled. The memory device 150 also includes a plurality of memory dies, each of which includes a plurality of planes, each of which includes memory blocks, among the plurality of memory blocks 152, 154, 156. In addition, the memory device 150 may be a non-volatile memory device, for example a flash memory, wherein the flash memory may be a three-dimensional stack structure.

The controller 130 may control overall operations of the memory device 150, such as read, write, program and erase operations. For example, the controller 130 may control the memory device 150 in response to a request from the host 102. The controller 130 may provide the data, read from the memory device 150, with the host 102. The controller 130 may store the data, provided by the host 102, into the memory device 150.

The controller 130 may include a host interface (I/F) 132, a processor 134, an error correction code (ECC) circuitry 138, a power management unit (PMU) 140, a memory interface (I/F) 142 and a memory 144, all operatively coupled via an internal bus.

The host interface 132 may process commands and data provided from the host 102, and may communicate with the host 102 through at least one of various interface protocols, such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE). In accordance with an embodiment, the host interface 132 is a component for exchanging data with the host 102, which may be implemented through firmware called a host interface layer (HIL).

The ECC circuitry 138 may correct error bits of the data to be processed in (e.g., outputted from) the memory device 150, which may include an ECC encoder and an ECC decoder. Here, the ECC encoder may perform error correction encoding of data to be programmed in the memory device 150 to generate encoded data into which a parity bit is added and store the encoded data in memory device 150. The ECC decoder may detect and correct errors contained in a data read from the memory device 150 when the controller 130 reads the data stored in the memory device 150. In other words, after performing error correction decoding on the data read from the memory device 150, the ECC circuitry 138 may determine whether the error correction decoding has succeeded and output an instruction signal (e.g., a correction success signal or a correction fail signal). The ECC circuitry 138 may use the parity bit which is generated during the ECC encoding process, for correcting the error bit of the read data. When the number of the error bits is greater than or equal to a threshold number of correctable error bits, the ECC circuitry 138 may not correct error bits but instead may output an error correction fail signal indicating failure in correcting the error bits.

The ECC circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), or a Block coded modulation (BCM). The ECC circuitry 138 may include any and all circuits, modules, systems or devices for performing the error correction operation based on at least one of the above described codes.

The PMU 140 may manage an electrical power provided in the controller 130. For example, the PMU 140 may detect the power-on 312 and the power-off 314 described in FIG. 1. In addition, the PMU 140 may include a power detector.

The memory interface 142 may serve as an interface for handling commands and data transferred between the controller 130 and the memory device 150, to allow the controller 130 to control the memory device 150 in response to a request delivered from the host 102. The memory interface 142 may generate a control signal for the memory device 150 and may process data entered into or outputted from the memory device 150 under the control of the processor 134 in a case when the memory device 150 is a flash memory and, in particular, when the memory device 150 is a NAND flash memory. The memory interface 142 may provide an interface for handling commands and data between the controller 130 and the memory device 150, for example, operations of NAND flash interface, in particular, operations between the controller 130 and the memory device 150. In accordance with an embodiment, the memory interface 142 may be implemented through firmware called a flash interface layer (FIL) as a component for exchanging data with the memory device 150.

The memory 144 may support operations performed by the memory system 110 and the controller 130. The memory 144 may store temporary or transactional data generated or delivered for operations in the memory system 110 and the controller 130. The controller 130 may control the memory device 150 in response to a request from the host 102. The controller 130 may deliver data read from the memory device 150 into the host 102. The controller 130 may store data entered through the host 102 within the memory device 150. The memory 144 may be used to store data required for the controller 130 and the memory device 150 to perform operations such as read operations or program/write operations.

The memory 144 may be implemented with a volatile memory. The memory 144 may be implemented with a static random access memory (SRAM), a dynamic random access memory (DRAM) or both. Although FIG. 2 exemplifies the memory 144 disposed within the controller 130, the present invention is not limited to that arrangement. That is, the memory 144 may be within or externally to the controller 130. For instance, the memory 144 may be embodied by an external volatile memory having a memory interface transferring data and/or signals between the memory 144 and the controller 130.

The memory 144 may store data for performing operations such as data writing and data reading requested by the host 102 and/or data transfer between the memory device 150 and the controller 130 for background operations such as garbage collection and wear levelling as described above. In accordance with an embodiment, for supporting operations in the memory system 110, the memory 144 may include a program memory, a data memory, a write buffer/cache, a read buffer/cache, a data buffer/cache and a map buffer/cache.

The processor 134 may be implemented with a microprocessor or a central processing unit (CPU). The memory system 110 may include one or more processors 134. The processor 134 may control overall operation of the memory system 110. By way of example but not limitation, the processor 134 can control a program operation or a read operation of the memory device 150, in response to a write request or a read request entered from the host 102. In accordance with an embodiment, the processor 134 may use or execute firmware to control the overall operations of the memory system 110. Herein, the firmware may be a flash translation layer (FTL). The FTL may serve as an interface between the host 102 and the memory device 150. The host 102 may transmit requests for write and read operations to the memory device 150 through the FTL.

The FTL may manage operations of address mapping, garbage collection, wear-leveling and so forth. Particularly, the FTL may load, generate, update, or store map data.

Therefore, the controller 130 may map a logical address, which is entered from the host 102, with a physical address of the memory device 150 through the map data. The memory device 150 may otherwise function as a general storage device to perform a read or write operation because of the address mapping operation. Also, through the address mapping operation based on the map data, when the controller 130 tries to update data stored in a particular page, the controller 130 may program the updated data on another empty page and may invalidate old data of the particular page (e.g., update a physical address, corresponding to a logical address of the updated data, from the particular page to the newly programed page) due to a characteristic of a flash memory device. Further, the controller 130 may store map data of the new data into the FTL.

For example, when performing an operation requested from the host 102 in the memory device 150, the controller 130 uses the processor 134. The processor 134 engaged with the memory device 150 may handle instructions or commands corresponding to an inputted command from the host 102. The controller 130 may perform a foreground operation as a command operation, corresponding to an command from the host 102, such as a program operation corresponding to a write command, a read operation corresponding to a read command, an erase/discard operation corresponding to an erase/discard command and a parameter set operation corresponding to a set parameter command or a set feature command with a set command.

For another example, the controller 130 may perform a background operation on the memory device 150 through the processor 134. By way of example but not limitation, the background operation for the memory device 150 includes copying data in a memory block, among the memory blocks 152, 154, 156, and storing such data in another memory block (e.g., a garbage collection (GC) operation). The background operation may include an operation to move data stored in at least one of the memory blocks 152, 154, 156 in the memory device 150, into at least another of the memory blocks 152, 154, 156 (e.g., a wear leveling (WL) operation). During a background operation, the controller 130 may use the processor 134 for storing the map data stored in the controller 130 to at least one of the memory blocks 152, 154, 156, e.g., a map flush operation. A bad block management operation of checking for bad blocks among the plurality of memory blocks 152, 154, 156 is another example of a background operation performed by the processor 134.

In the memory system 110, the controller 130 performs a plurality of command operations corresponding to a plurality of commands received from the host 102. For example, when performing a plurality of program operations corresponding to plural program commands, a plurality of read operations corresponding to plural read commands and a plurality of erase operations corresponding to plural erase commands sequentially, randomly or alternatively, the controller 130 may determine which channel(s) or way(s) for connecting the controller 130 to which memory die(s) in the memory 150 is/are proper or appropriate for performing each operation. The controller 130 may send or transmit data or instructions via determined the channel(s) or way(s) for performing each operation. The plurality of memory dies may transmit an operation result via the same channel(s) or way(s), respectively, after each operation is complete. Then, the controller 130 may transmit a response or an acknowledge signal to the host 102. In an embodiment, the controller 130 may check a status of each channel or each way. In response to a command received from the host 102, the controller 130 may select at least one channel or way based on the status of each channel or each way so that instructions and/or operation results with data may be delivered via selected channel(s) or way(s).

By way of example but not limitation, the controller 130 may recognize statuses regarding channels (or ways) associated with memory dies in the memory device 150. The controller 130 may determine each channel or each way as being in a busy state, a ready state, an active state, an idle state, a normal state, or an abnormal state. The controller's determination of which channel or way an instruction (and/or a data) is delivered through can be based on a physical block address, e.g., to which die(s) the instruction (and/or the data) is delivered. The controller 130 may refer to descriptors delivered from the memory device 150. The descriptors may include a block or page of parameters that describe relevant characteristics about the memory device 150, which is a data with a set format or structure. For instance, the descriptors may include device descriptors, configuration descriptors, unit descriptors, and the like. The controller 130 can refer to, or use, the descriptors to determine with which channel(s) or way(s) an instruction or a data is exchanged.

A management unit (not shown) may be included in the processor 134. The management unit may perform bad block management of the memory device 150. The management unit may find bad memory blocks, which are in unsatisfactory condition for further use, as well as perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. The bad blocks may seriously aggravate the utilization efficiency of the memory device 150 having a 3D stack structure and the reliability of the memory system 110. Thus, reliable bad block management may enhance or improve performance of the memory system 110.

Figure 3:
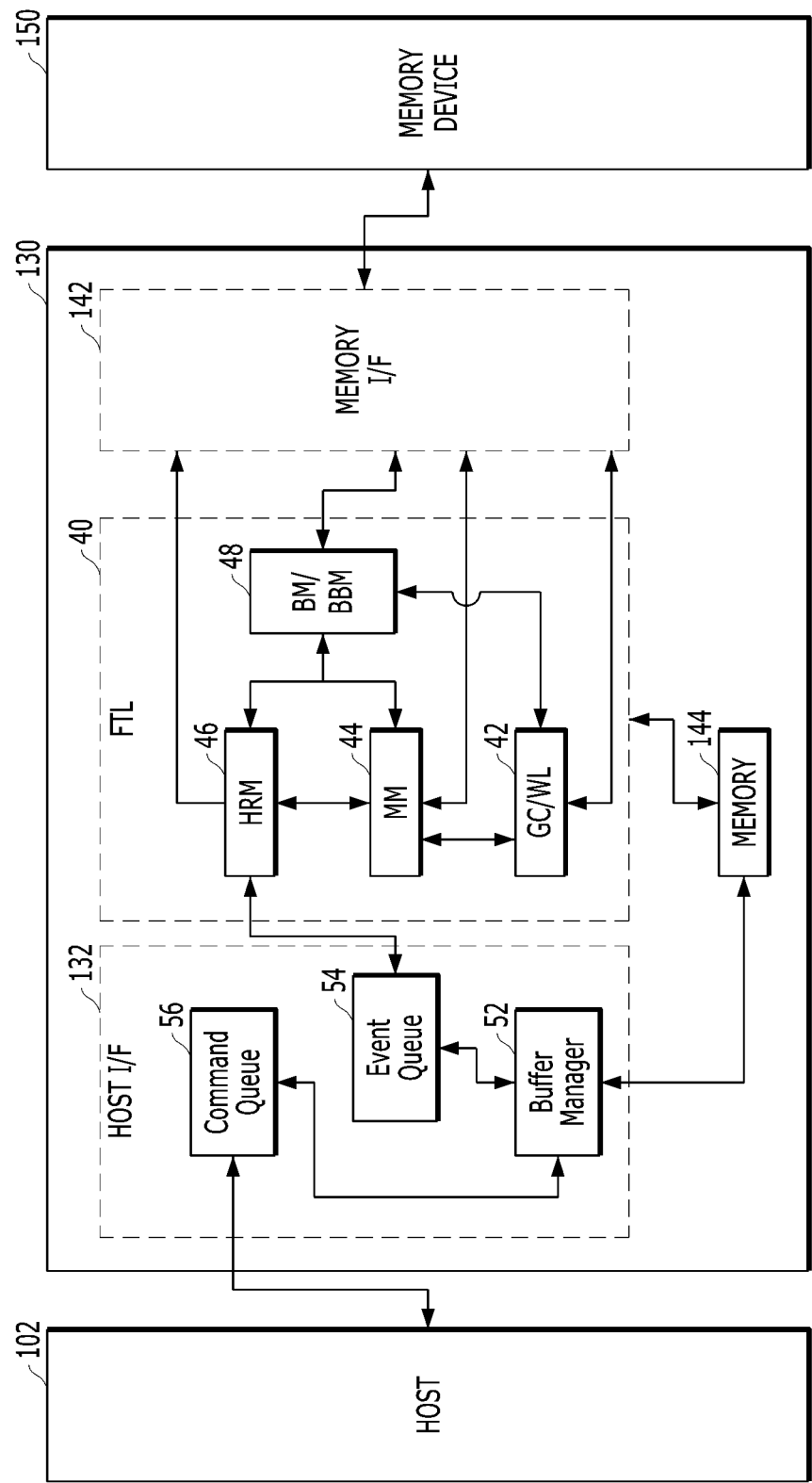
FIG. 3 illustrates a controller in a memory system according to an embodiment of the disclosure.

FIG. 3 illustrates a controller 130 in a memory system according to an embodiment of the disclosure. Referring to FIG. 3, the controller 130 cooperates with the host 102 and the memory device 150. The controller 130 may include a host interface (I/F) 132, a flash translation layer (FTL) circuitry 40, a memory interface (I/F) 142 and a memory 144.

Although not shown in FIG. 3, in accordance with an embodiment, the ECC circuitry 138 in FIG. 2 may be included in the flash translation layer (FTL) circuitry 40. In another embodiment, the ECC circuitry 138 may be implemented as a separate module, a circuit, or firmware, which is included in, or associated with, the controller 130.

The host interface 132 may handle commands and data from the host 102. By way of example but not limitation, the host interface 132 may include a command queue 56, a buffer manager 52 and an event queue 54. The command queue 56 may sequentially store commands and data from the host 102 and output them to the buffer manager 52 in a stored order. The buffer manager 52 may classify, manage or adjust the commands and the data, which are delivered from the command queue 56. The event queue 54 may sequentially transmit events for processing the commands and the data, from the buffer manager 52.

A plurality of commands or data of the same characteristic may be continuously received from the host 102, or commands and data of different characteristics may be transmitted to the memory system 110 after being mixed or jumbled.

For example, a plurality of commands for reading data (i.e., read commands) may be delivered, or read commands and program/write commands may be alternately transmitted to the memory system 110. The host interface 132 may store commands and data, which are received from the host 102, to the command queue 56 sequentially. Thereafter, the host interface 132 may estimate or predict what kind of internal operation the controller 130 will perform according to the characteristics, e.g., type, of the command and data, which is received from the host 102. The host interface 132 may determine a processing order and a priority of commands and data, based at least on their characteristics. According to characteristics of commands and data, from the host 102, the buffer manager 52 in the host interface 132 is configured to determine whether the buffer manager 52 should store commands and data in the memory 144, or whether the buffer manager 52 should deliver the commands and the data into the flash translation layer (FTL) circuitry 40. The event queue 54 receives events, entered from the buffer manager 52, which are to be internally executed and processed by the memory system 110 or the controller 130 in response to the commands and the data from the host 102, so as to deliver the events into the flash translation layer (FTL) circuitry 40 in the order received.

In accordance with an embodiment, the host interface 132 in FIG. 3 may perform the functions of the controller 130 in FIG. 1.

In accordance with an embodiment, the flash translation layer (FTL) circuitry 40 may include a state manager (GC/WL) 42, a map manager (MM) 44, a host request manager (HRM) 46, and a block manager (BM/BBM) 48. The host request manager 46 may manage the events entered from the event queue 54. The map manager 44 may handle or control a map data. The state manager 42 may perform garbage collection (GC) or wear leveling (WL). The block manager 48 may execute commands or instructions onto a block in the memory device 150.

By way of example but not limitation, the host request manager 46 may use the map manager 44 and the block manager 48 to handle or process requests according to the read and program commands, and events which are delivered from the host interface 132. The host request manager 46 may send an inquiry or request to the map data manager 44, to determine a physical address corresponding to the logical address which is entered with the events. The host request manager 46 may send a read request with the physical address to the memory interface 142, to process the read request (i.e., handle the events). On the other hand, the host request manager 46 may send a program request (or write request) to the block manager 48, to program entered data to an empty page (i.e., a page having no data) in the memory device 150, and then, may transmit a map update request corresponding to the program request to the map manager 44, to update an item relevant to the programmed data in information of mapping the logical-physical addresses to each other.

Here, the block manager 48 may convert a program request delivered from the host request manager 46, the map data manager 44, and/or the state manager 42 into a flash program request used for the memory device 150, to manage flash blocks in the memory device 150. In order to enhance program or write performance of the memory system 110 (see FIG. 2), the block manager 48 may collect program requests and send flash program requests for multiple-plane and one-shot program operations to the memory interface 142. The block manager 48 may send several flash program requests to the memory interface 142 to enhance parallel processing of the multi-channel and multi-directional flash controller.

The block manager 48 may be configured to manage blocks in the memory device 150 according to the number of valid pages, select and erase blocks having no valid pages when a free block is needed, and select a block including the least number of valid pages when it is determined that garbage collection is necessary. The state manager 42 may perform garbage collection to move the valid data to an empty block and erase remaining data in the blocks from which the valid data was moved so that the block manager 48 may have enough free blocks (i.e., empty blocks with no data). If the block manager 48 provides information regarding a block to be erased to the state manager 42, the state manager 42 is able to check all flash pages of the block to be erased to determine whether each page is valid. For example, to determine validity of each page, the state manager 42 may identify a logical address stored in an out-of-band (OOB) area of each page. To determine whether each page is valid, the state manager 42 may compare the physical address of the page with the physical address mapped to the logical address obtained from the request. The state manager 42 sends a program request to the block manager 48 for each valid page. A mapping table may be updated through the update of the map manager 44 when the program operation is complete.

The map manager 44 may manage a logical-to-physical mapping table. The map manager 44 may process requests such as queries and updates, which are generated by the host request manager 46 or the state manager 42. The map manager 44 may store the entire mapping table in the memory device 150 (e.g., a flash/non-volatile memory) and cache mapping entries according to the storage capacity of the memory 144. When a map cache miss occurs while processing inquiry or update requests, the map manager 44 may send a read request to the memory interface 142 to load a relevant mapping table stored in the memory device 150. When the number of dirty cache blocks in the map manager 44 exceeds a certain threshold, a program request may be sent to the block manager 48 so that a clean cache block is made and the dirty map table may be stored in the memory device 150.

When garbage collection is performed, the state manager 42 copies valid page(s) into a free block, and the host request manager 46 may program the latest version of the data for the same logical address of the page and currently issue an update request. When the state manager 42 requests the map update in a state in which copying of valid page(s) has not been completed, the map manager 44 may not perform the mapping table update. This is because the map request is issued with old physical information if the state manger 42 requests a map update and a valid page copy is not completed until later. The map manager 44 may perform a map update operation to ensure accuracy only if the latest map table still points to the old physical address.

In accordance with an embodiment, the flash translation layer (FTL) circuitry 40 may include the pairing component 190 shown in FIG. 1, and the memory interface 142 may include the operation execution component 196 and the host interface 132 may include the operation the input and output buffer manager 198 shown in FIG. 1. In another embodiment, the memory interface 142 includes the pairing component 190, the operation execution component 196 and the input and output buffer manager 198 shown in FIG. 1.

The memory device 150 may include a plurality of memory blocks. Each of the plurality of memory blocks may be a single level cell (SLC) memory block or a multi level cell (MLC) memory block, according to the number of bits that can be stored or represented in one memory cell of such block. Here, the SLC memory block includes a plurality of pages implemented by memory cells, each storing one bit of data. The SLC memory block can have high data I/O operation performance and high durability. The MLC memory block includes a plurality of pages implemented by memory cells, each storing multi-bit data (e.g., two bits or more). The MLC memory block can have a larger storage capacity for the same space compared to the SLC memory block. The MLC memory block can be highly integrated in terms of storage capacity. In an embodiment, the memory device 150 may be implemented with MLC memory blocks, such as a double level cell memory block, a triple level cell (TLC) memory block, a quadruple level cell (QLC) memory block or a combination thereof. The double level memory block may include a plurality of pages implemented by memory cells, each capable of storing 2-bit data. The triple level cell (TLC) memory block may include a plurality of pages implemented by memory cells, each capable of storing 3-bit data. The quadruple level cell (QLC) memory block may include a plurality of pages implemented by memory cells, each capable of storing 4-bit data. In another embodiment, the memory device 150 may be implemented with a block including a plurality of pages implemented by memory cells, each capable of storing 5-bit or more bit data.

In an embodiment of the disclosure, the memory device 150 is embodied as a nonvolatile memory such as a flash memory such as a NAND flash memory, a NOR flash memory and the like. In another embodiment, the memory device 150 may be implemented by at least one of a phase change random access memory (PCRAM), a ferroelectrics random access memory (FRAM) and a spin injection magnetic memory (e.g., a spin transfer torque magnetic random access memory (STT-M RAM)).

Figure 4:
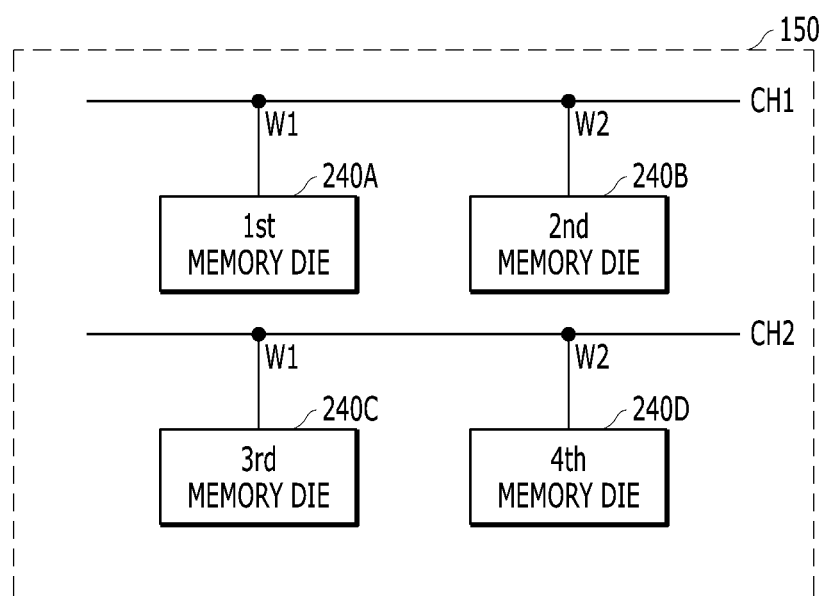
FIG. 4 illustrates a memory device in a memory system according to an embodiment of the invention.

FIG. 4 illustrates an internal configuration of the memory device 150.

Referring to FIG. 4, the memory device 150 may include the plurality of memory dies 240A to 240D. The first memory die 240A and the second memory die 240B may be coupled to the controller 130 through a first channel CH1. The third memory die 240C and the fourth memory die 240D may be coupled to the controller 130 through a second channel CH2.

By way of example, FIG. 4 illustrates the configuration in which the four memory dies 240A to 240D are coupled to the controller 130 through the two channels CH1 and CH2. However, the memory device 150 may include a different number of memory dies, such as two or eight memory dies, and the number of channels may also vary; for example, there may be 2, 3, 4 or 5 channels. The number of memory dies within the memory device 150 and the number of channels may be changed according to the purpose of use and the performance requirement of the memory system 110.

When a plurality of memory dies are coupled to one channel, each of the memory dies may be coupled to the channel through a way. In the illustrated example of FIG. 4, the first memory die 240A and the second memory die 240B may be coupled to the first channel CH1 through a first way W1 and a second way W2, respectively. The third memory die 240C and the fourth memory die 240D may be coupled to the second channel CH2 through a first way W1 and a second way W2, respectively. The number of ways may be decided depending on how many memory dies are coupled to each of the channels.

Figure 5A:
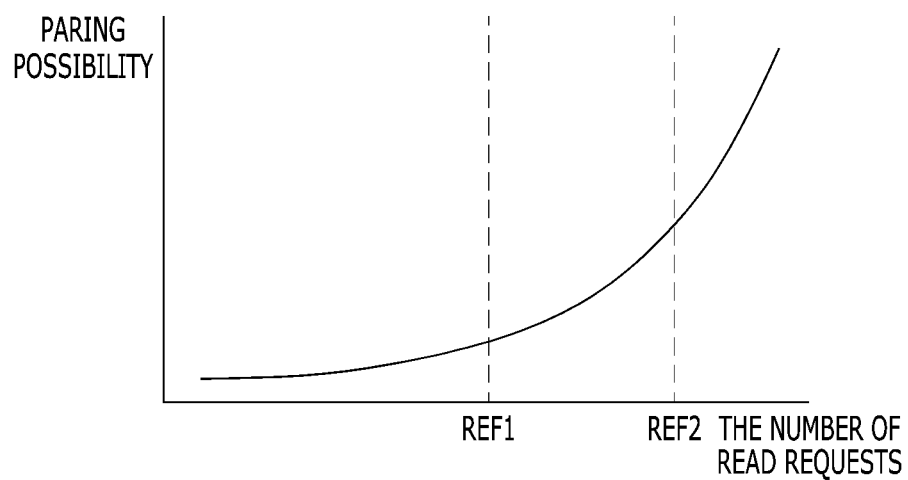
FIGS. 5A and 5B illustrate characteristics of a correlation operation performed by a controller according to an embodiment of the invention.
Figure 5B:
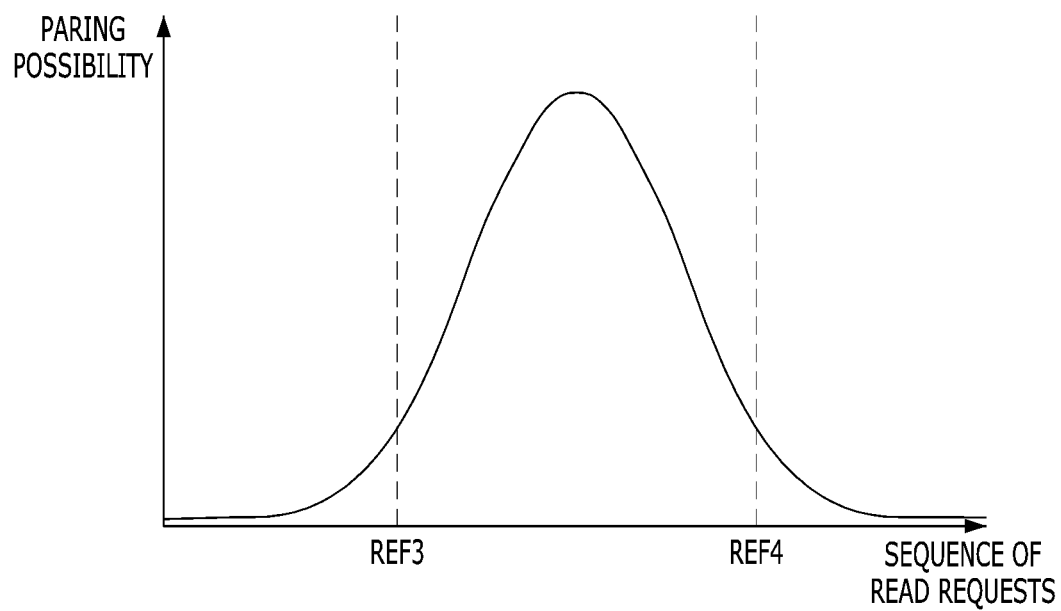

FIGS. 5A and 5B illustrate the characteristics of the pairing operation performed by the controller 130. Specifically, FIGS. 5A and 5B do not illustrate pairing possibility related to read requests in a limited specific situation, but illustrate results which can be obtained when unspecific and random situations are repeated.

FIG. 5A illustrates that the pairing possibility may increase as the number of read requests on which the pairing operation is performed increases. For example, the possibility that read requests will be paired when there are 20 read requests available for the pairing operation is higher than the possibility that read requests will be paired through a pairing operation for five read requests.

When there is no address limitation, physical locations within the memory device 150, corresponding to logical addresses transferred with a plurality of read requests, may not be distributed in some cases. In this case, a smaller number of read requests may be paired through the pairing component 190. However, as a plurality of read requests are transferred to the memory system 110 several times or a large number of read requests are transferred, the possibility that read requests will be paired may increase. For example, the pairing possibility when the number of read requests is equal to a second reference value REF2 may become higher than when the number of read requests is equal to a first reference value REF1, which is less than REF2.

FIG. 5B illustrates the pairing possibility depending on input points of time, when a plurality of read requests are sequentially transferred to the pairing component 190. As described with reference to FIG. 4, it is assumed that there are two channels between the controller 130 and the memory device 150 within the memory system 110. For example, a first read request transferred to the pairing component 190 cannot be paired because there is no other read request with which to be paired. When a second read request is transferred to the pairing component 190, the second read request may or may not be paired with the first read request. When a third read request is transferred to the pairing component 190, the pairing component 190 may try to pair the third read request with the first or second read request. Therefore, the pairing possibility at the time that the third read request is transferred may be higher than at the time that the second read request is transferred. Based on such characteristics, the pairing component 190 may distinguish between before and after the third read request is transferred, and not try a pairing operation when the pairing possibility is low, i.e., when less than three read requests have been received, but try a pairing operation when the pairing possibility is high, i.e., when three or more read requests have been received.

Furthermore, suppose that 20 read requests are transferred. The pairing possibility at the time that 19th and 20th read requests among the 20 read requests are inputted may be lower than at the time that 9th to 11th read requests are inputted. That is because, when most of the plurality of read requests have been inputted, paired read requests may have already been outputted to the operation execution component 196 after the pairing. As the number of read requests which are paired and outputted increases over a certain time, the pairing possibility may decrease. When a new read request is not transferred after the pairing possibility decreases, the pairing possibility is difficult to increase again. In order to avoid wasting resources (for example, time and operation margin) by attempting the pairing operation, the pairing component 190 may stop the pairing operation at the time that the fourth read request is transferred.

In an embodiment, the pairing component 190 may stop the pairing operation in response to a certain number of read requests which are not paired. When two or three unpaired read requests remain, among the transferred 20 read requests, the pairing component 190 may not hold those read requests for the pairing operation, but output the read requests to the operation execution component 196. When the pairing component 190 holds a small number of read requests in order to perform a pairing operation on the corresponding read requests, data I/O throughput of the memory system 110 may be degraded.

FIG. 6 is a diagram illustrating an internal configuration of the controller 130 in accordance with an embodiment of the disclosure.

Referring to FIG. 6, the controller 130 may include an input/output buffer manager 198, a pairing component 190, and an operation execution component 196. The pairing component 190 may include a pairing decision component 192 and a pairing execution component 194. For example, the input/output buffer manager 198, the pairing decision component 192, the pairing execution component 194 and the operation execution component 196 may decide whether to perform a pairing operation, in collaboration with an output buffer 186, an input buffer 184 and a map memory 182.

The controller 130 may include the memory 144 including the output buffer 186, the input buffer 184 and the map memory 182. According to an embodiment, the output buffer 186, the input buffer 184 and the map memory 182 may be functional divisions within the memory 144 described above with reference to FIGS. 2 and 3. Also, according to an embodiment, the output buffer 186, the input buffer 184 and the map memory 182 may be realized by a plurality of nonvolatile memory devices or a plurality of cache memories. For example, each of the output buffer 186 and the input buffer 184 may have a data structure like a queue. In this case, each of the output buffer 186 and the input buffer 184 may output data according to an order in which the data are stored (FIFO). The map memory 182 may have any of various structures depending on storage and management policies of map data and map information.

The controller 130 may translate a logical address, as an address transferred from an external device or the host 102, into a physical address indicating a physical location in the memory device 150. For the address translation, the controller 130 may load the map data and map information stored in the memory device 150.

According to an embodiment, in the case where the storage space of the memory 144 is sufficient, all of the map data and map information used for the address translation may be fetched at the same time. However, in the case of the memory system 110 mounted in a mobile terminal or the like, it may be difficult for the controller 130 to have a sufficient storage space capable of storing all of the map data and map information. In this case, the controller 130 may utilize the space of the memory 144, in which the map data and map information are stored, more selectively to fetch specific map information from the memory device 150, store the map information in the memory device 150 after using or updating the map information, and fetch another map information stored in the memory device 150.

In the case where requested map data cannot be stored in a region of the memory 144, the controller 130 may remove least recently used map data in the region. As another example, in the case where requested map data cannot be stored in a region of the memory 144, the controller 130 may remove least frequently used map data in the corresponding region. The fact that the controller 130 requests map data and map information for address translation to the memory device 150 may serve as an overhead in the overall performance or input/output throughput of the memory system 110. Therefore, it is necessary to cause the controller 130 not to request unnecessary map data and map information.

For example, it is assumed that there are 20 read requests for pairing. As a result of checking the map memory 182 based on logical addresses related with the 20 read requests, map data and map addresses for 11 read requests may be in the map memory 182, and map data and map addresses for 9 read requests may not be in the map memory 182. In this case, the controller 130 may load the map data and map addresses for the 9 read requests to the map memory 182. According to an embodiment, in the case where the storage space of the map memory 182 is not sufficient, the pairing execution component 194 may preferentially perform a pairing operation on read requests whose map addresses can be checked.

The input/output buffer manager 198 may count the number of pieces of data to be outputted to the host 102, stored in the output buffer 186. Hereinafter, for convenience, data stored in the output buffer 186 and to be outputted to the host 102 is referred to as 'read data.' The input/output buffer manager 198 transfers the counted number OUT DATA_COUNT (see FIG. 8) of pieces of read data to the pairing decision component 192. The reason why, as such, multiple output data is transferred to the pairing decision component 192 resides in that, if a plurality of read requests and logical addresses corresponding thereto are transferred to the pairing component 190 each time they are inputted to the input buffer 184, without considering the transmission time of the read data stored in the output buffer 186, overhead due to a pairing operation may be incurred, thereby degrading the data input/output throughput of the memory system 110.

Therefore, in order to increase the pairing probability for the pairing operation, the input/output buffer manager 198 transfers the number OUT DATA_COUNT of pieces of read data to the pairing decision component 192, to decide whether to transfer read requests to the pairing execution component 194 after receiving them from the host 102 and gathering them in the input buffer 184 for a set time, or transfer read requests and logical addresses corresponding thereto inputted so far to the input buffer 184, to the pairing execution component 194.

The input/output buffer manager 198 may receive a result of the decision made by the pairing decision component 192. If the input/output buffer manager 198 receives a decision result to the effect that read requests be additionally received from the host 102 and be stored in the input buffer 184 for a third operation margin, the input/output buffer manager 198 may additionally receive read requests from the host 102 and store them in the input buffer 184 during the third operation margin. Then, in order to perform the pairing operation, the input/output buffer manager 198 may transfer the plurality of read requests and logical addresses corresponding thereto stored in the input buffer 184, to the pairing execution component 194. The third operation margin refers to a time for additionally gathering a plurality of read requests and logical addresses corresponding thereto without causing a degradation in the input/output throughput of the memory system 110.

On the other hand, if the input/output buffer manager 198 receives a decision result from the pairing decision component 192 to the effect that a plurality of read requests and logical addresses corresponding thereto inputted so far to the input buffer 184 be transferred to the pairing execution component 194, the input/output buffer manager 198 may transfer the plurality of read requests and the logical addresses corresponding thereto, inputted so far to the input buffer 184, to the pairing execution component 194.

The pairing decision component 192 may decide whether to perform pairing, in correspondence to the number of pieces of output data that is received from the input/output buffer manager 198. That is to say, the pairing decision component 192 may calculate a first operation margin for data to be outputted from the memory system 110 to the host 102, in correspondence to the number of pieces of output data that is received from the input/output buffer manager 198. Further, the pairing decision component 192 may calculate a second operation margin in correspondence to a data input/output speed between the controller 130 and the plurality of memory dies that is received from the operation execution component 196. Further, by using the first operation margin and the second operation margin, the third operation margin for additionally gathering a plurality of read requests and logical addresses corresponding thereto in the input buffer 184 and a fourth operation margin for the pairing operation on the plurality of read requests may be calculated.

Figure 8:
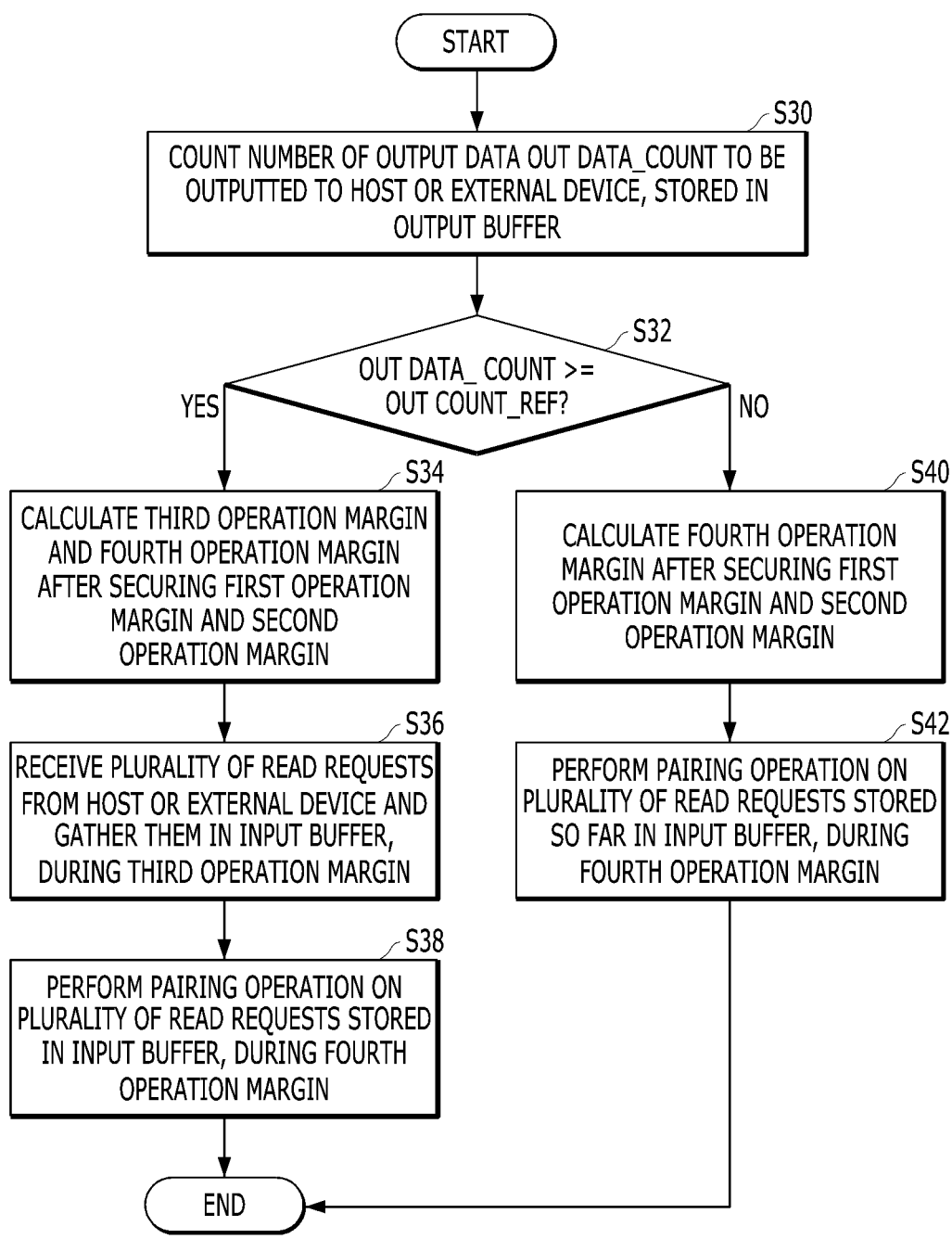
FIG. 8 is a flow chart illustrating a method for a controller to decide whether to perform a pairing operation in accordance with an embodiment of the disclosure.

In detail, the pairing decision component 192 may compare the number OUT DATA_COUNT of pieces of read data received from the input/output buffer manager 198 with an output count reference value OUT COUNT_REF (see FIG. 8). As a result of the comparison, when it is determined that the number OUT DATA_COUNT of pieces of read data is greater than or equal to the output count reference value OUT COUNT_REF, the pairing decision component 192 may calculate the third operation margin and the fourth operation margin by using the first operation margin and the second operation margin. In this regard, the pairing decision component 192 may flexibly set a percentage of the third operation margin and a percentage of the fourth operation margin in correspondence to the difference between the first operation margin and the second operation margin. In other words, in order to calculate the percentages of the third operation margin and the fourth operation margin, the pairing decision component 192 compares the difference between the first operation margin and the second operation margin with an operation margin reference value TIME_REF. As a result of the comparison, if the difference between the first operation margin and the second operation margin is greater than or equal to the operation margin reference value TIME_REF, the percentage of the third operation margin for receiving read requests from the host 102 and gathering them in the input buffer 184 may be set to be higher than the percentage of the fourth operation margin for performing the pairing operation. On the other hand, if the difference between the first operation margin and the second operation margin is less than the operation margin reference value TIME_REF, the percentage of the third operation margin for receiving read requests from the host 102 and gathering them in the input buffer 184 may be set to be less than the percentage of the fourth operation margin for performing the pairing operation. The pairing decision component 192 transfers the third operation margin set in this way to the input/output buffer manager 198, and transfers the fourth operation margin set in this way to the pairing execution component 194.

For example, it is assumed that, when the memory system 110 transmits read data to the host 102, it takes 10 ms to transmit one read data, the output count reference value OUT COUNT_REF is 8 and the operation margin reference value TIME_REF is 80 ms. If 10 read data to be outputted to the host 102 are stored in the output buffer 186, it may be determined that the number OUT DATA_COUNT of pieces of read data is greater than or equal to 8, which is the output count reference value OUT COUNT_REF. Since there are 10 read data, the memory system 110 may have the first operation margin of 100 ms (=10×10). For example, assuming that the second operation margin of 5 ms is required to transfer a read request and receive data between the controller 130 and the memory device 150 in the memory system 110, the controller 130 may additionally gather a plurality of read requests and logical addresses corresponding thereto inputted from the host 102, in the input buffer 184 and may then try a pairing operation, for maximum 95 ms in the first operation margin of 100 ms. It is determined whether the maximum 95 ms is greater than or equal to the operation margin reference value TIME_REF of 80 ms. Since the maximum 95 ms is greater than the operation margin reference value TIME_REF, it is determined that there is a sufficient operation margin, and thereby, the percentage of the third operation margin for additionally gathering a plurality of read requests and logical addresses corresponding thereto, inputted from the host 102, in the input buffer 184 may be determined to be greater than the percentage of the fourth operation margin for performing the pairing operation.

On the other hand, in the case where the number OUT DATA_COUNT of pieces of read data is less than the output count reference value OUT COUNT_REF, the pairing decision component 192 calculates only the fourth operation margin for performing the pairing operation, through the difference between the first operation margin and the second operation margin, transfers the fourth operation margin to the pairing execution component 194, and transfers a decision result to the input/output buffer manager 198 to the effect that a plurality of read requests and logical addresses corresponding thereto inputted so far to the input buffer 184 be transferred to the pairing execution component 194.

For example, it is assumed that, when the memory system 110 transmits data to the host 102, it takes 10 ms to transmit one piece of data and the output count reference value OUT COUNT_REF is 8. If 5 pieces of read data to be outputted to the host 102 are stored in the output buffer 186, it may be determined that the number OUT DATA_COUNT of pieces of read data is less than 8, which is the output count reference value OUT COUNT_REF. Since the 5 pieces of read data to be outputted to the host 102 are in the output buffer 186, the memory system 110 may have the first operation margin of 50 ms (=5×10). For example, assuming that the second operation margin of 5 ms is required to transfer a read request and receive data between the controller 130 and the memory device 150 in the memory system 110, the controller 130 may try the pairing operation on a plurality of read requests and corresponding logical addresses stored so far in the input buffer 184, for maximum 45 ms in the first operation margin of 50 ms.

According to an embodiment, a time range in which the controller 130 may try pairing may vary. Also, in order to increase the probability of pairing in a particular operation environment of the memory system 110 including the operation state of the memory device 150, the controller 130 may determine an operation margin for receiving read requests from the host 102, gathering them in the input buffer 184 and trying pairing.

The pairing operation performed by the pairing execution component 194 may be recognized as an overhead in terms of the input/output throughput of the memory system 110 (see FIGS. 1 to 3). Therefore, it may be more desirable to cause the operation execution component 196 not to be in an idle state than to cause the pairing execution component 194 to perform a pairing operation on all transferred read requests. Based on the nature of the pairing operation described above with reference to FIGS. 5A and 5B, the pairing execution component 194 may decide whether to perform the pairing operation. For example, in the case where the number of transferred read requests is less than a first reference value REF1, the pairing execution component 194 may not perform the pairing operation. In addition, the pairing execution component 194 may transfer a read request, first transferred to the pairing execution component 194, to the operation execution component 196, without performing the pairing operation thereon. Furthermore, in the case where the number of read requests remaining in the pairing execution component 194 is less than a reference number, the pairing execution component 194 may stop the pairing operation.

Figure 7:
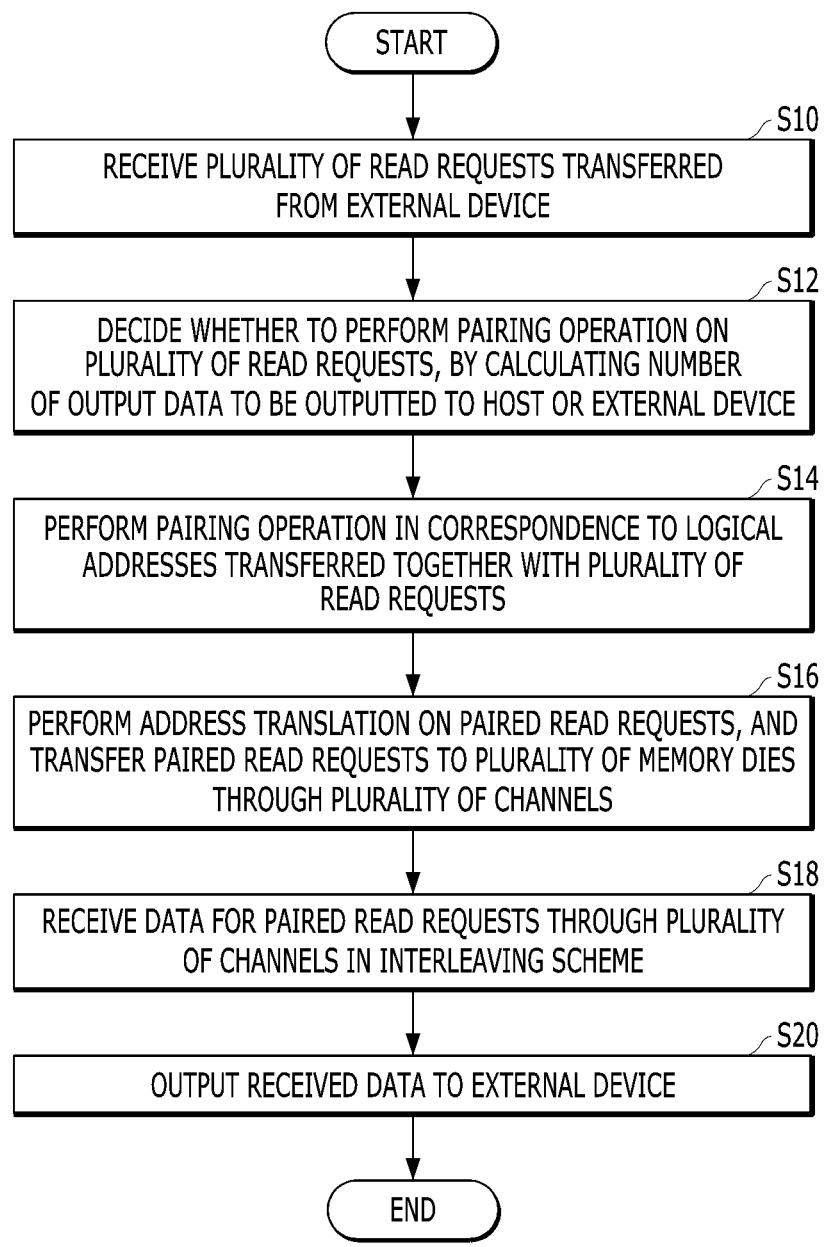
FIG. 7 is a flow chart illustrating a method for operating a memory system in accordance with an embodiment of the disclosure.

FIG. 7 is a flow chart illustrating a method for operating a memory system 110 in accordance with an embodiment of the disclosure.

Referring to FIG. 7, the method for operating the memory system 110 may include step S10 to step S20. At step S10, the memory system 110 may receive a plurality of read requests transferred from the external device or the host 102. At step S12, the memory system 110 may decide whether to perform a pairing operation on the plurality of read requests, by counting the number OUT DATA_COUNT (see FIG. 8) of pieces of read data to be outputted to the host 102. At step S14, the memory system 110 may perform the pairing operation in correspondence to logical addresses transferred together with the plurality of read requests. At step S16, the memory system 110 may transfer paired read requests to a plurality of memory dies through a plurality of channels by performing address translation on the paired read requests. At step S18, the memory system 110 may receive data for the paired read requests through the plurality of channels in the interleaving scheme. At step S20, the memory system 110 may output the received data to the host 102.

Although not illustrated, the method for operating a memory system may further include a step of transferring unpaired read requests to the plurality of memory dies after performing address translation sequentially on the unpaired read requests, and a step of receiving data corresponding to the unpaired read requests from the plurality of memory dies. For example, the memory system 110 may not perform read requests according to an order in which the read requests are inputted, but may decide an execution order of the read requests according to whether they are paired or not. The memory system 110 may first execute paired read requests, and then, may execute unpaired read requests.

Step S12 of deciding whether to perform a pairing operation on the plurality of read requests may refer to the number OUT DATA_COUNT of pieces of read data to be outputted to the host 102, stored in the output buffer 186. In order to perform the pairing operation without degrading the input/output throughput of the memory system 110, an operation margin may be secured with respect to the number OUT DATA_COUNT of pieces of read data, a plurality of read requests inputted from the host 102 may be gathered in the input buffer 184 during the secured operation margin, and then the pairing operation may be performed, or the pairing operation may be performed on a plurality of read requests inputted so far to the input buffer 184. This will be described below in detail with reference to FIG. 8.

Step S14 may include performing the pairing operation according to an order in which the plurality of read requests are transferred. By transferring paired read requests earlier than unpaired read requests, the input/output throughput of the memory system 110 may be improved.

To avoid degradation in the input/output throughput of the memory system 110, the pairing operation may not be tried for some of a plurality of read requests. For example, if a module which performs address translation is in an idle state, the pairing operation may not be tried for a first read request or first and second read requests.

Moreover, in the case where map data related with logical addresses in a plurality of read requests are not in a region within a cache memory or a volatile memory, the method for operating a memory system may include step of requesting the corresponding map data to the plurality of memory dies. In the case where a space for storing map data is not sufficient in the cache memory or the volatile memory, necessary map data may be loaded, and unnecessary map data may be programmed to the memory device 150. For example, in the case where requested map data cannot be stored in the region, least recently used map data in the region may be removed. According to an embodiment, in the case where requested map data cannot be stored in the region, least frequently used map data in the region may be removed.

In step S16, the address translation may be performed on the respective read requests according to an execution order that is changed by the pairing operation. By translating the logical addresses transferred together with the paired read requests into physical locations where data are stored, through using map data and map information loaded in the map memory 182, the corresponding read requests may be transferred to the memory device 150.

In step S18, the corresponding memory dies may output data in correspondence to the read requests transferred to the respective memory dies. In correspondence to the read requests transferred to the respective memory dies, the respective memory dies may output data. The read requests transferred to the respective memory dies are transferred in such a way to sequentially use the channels, and the data outputted from the memory dies may also sequentially use the channels.

After receiving the data through the plurality of channels, the controller 130 may output the received data to the host 102 (S20). The controller 130 may temporarily store the received data in the output buffer 186, and the output buffer 186 may output the data to the host 102 in an order in which they are stored (S20).

FIG. 8 is a flow chart illustrating a method for the controller 130 to decide whether to perform a pairing operation in accordance with an embodiment of the disclosure. FIG. 8 shows an example of step S12 of FIG. 7. According to an embodiment, the method for deciding whether to perform the pairing operation may be performed by the pairing decision component 192 in the controller 130.

Referring to FIG. 8, the method may include step S30 to step S42. At step S30, the controller 130 may count the number OUT DATA_COUNT of pieces of read data stored in the output buffer 186 to be outputted to the host 102. At step S32, the controller 130 may compare the OUT DATA_COUNT and the output count reference value OUT COUNT_REF. At step S34, the controller 130 may calculate the third operation margin and the fourth operation margin after securing the first operation margin and the second operation margin in the case where, as a result of the comparison, the number OUT DATA_COUNT of pieces of read data is greater than or equal to the output count reference value OUT COUNT_REF (YES in S32). At step S36, the controller 130 may receive a plurality of read requests from the host 102 and gather them in the input buffer 184 during the third operation margin. At step S38, the controller 130 may perform the pairing operation on the plurality of read requests stored in the input buffer 184, during the fourth operation margin. At step S40, the controller 130 may calculate the fourth operation margin after securing the first operation margin and the second operation margin in the case where the number OUT DATA_COUNT of read data is less than the output count reference value OUT COUNT_REF (NO in S32). At step S42, the controller 130 may perform the pairing operation on a plurality of read requests stored so far in the input buffer 184, during the fourth operation margin.

The number OUT DATA_COUNT of pieces of read data stored in the output buffer 186 to be outputted to the host 102 is counted (S30). The reason why the number OUT DATA_COUNT of pieces of the read data temporarily stored in the output buffer 186 is calculated is because, if the pairing operation is performed on the plurality of read requests and logical addresses corresponding thereto stored in the input buffer 184, without considering a transmission time calculated in correspondence to the number OUT DATA_COUNT of pieces of the read data stored in the output buffer 186, the data input/output throughput of the memory system 110 may be degraded.

The number OUT DATA_COUNT of pieces of the read data and the output count reference value OUT COUNT_REF are compared (S32). As a result of the comparison, in the case where the number OUT DATA_COUNT of pieces of the read data is greater than or equal to the output count reference value OUT COUNT_REF (YES in S32), a plurality of read requests are received from the host 102 and are gathered in the input buffer 184, and then, the pairing operation is performed. The output count reference value OUT COUNT_REF indicates a minimum number of pieces of read data that allows the pairing operation to be performed after a plurality of read requests are received from the host 102 and are gathered in the input buffer 184.

Namely, the controller 130 may secure the first operation margin during which data are outputted to the host 102 with respect to the number OUT DATA_COUNT of pieces of the output data and the second operation margin with respect to a data input/output speed between the controller 130 and the plurality of memory dies 240A to 240D, and thereby, may calculate the third operation margin for gathering more read requests and logical addresses corresponding thereto in the input buffer 184 and the fourth operation margin for performing the pairing operation on the plurality of read requests (S34). In this regard, a percentage of the third operation margin and a percentage of the fourth operation margin may be flexibly set in correspondence to the difference between the first operation margin and the second operation margin. That is to say, a method for calculating the percentages of the third operation margin and the fourth operation margin compares the difference between the first operation margin and the second operation margin with the operation margin reference value TIME_REF. The operation margin reference value TIME_REF indicates a value calculated by multiplying the output number reference value TIME_REF by a time required to output read data stored in the output buffer 186.

As a result of the comparison, if the difference between the first operation margin and the second operation margin is greater than or equal to the operation margin reference value TIME_REF, the percentage of the third operation margin for receiving read requests from the host 102 and gathering them in the input buffer 184 may be set to be greater than the percentage of the fourth operation margin for performing the pairing operation. On the other hand, if the difference between the first operation margin and the second operation margin is less than the operation margin reference value TIME_REF, the percentage of the third operation margin for receiving read requests from the host 102 and gathering them in the input buffer 184 may be set to be less than the percentage of the fourth operation margin for performing the pairing operation. During the third operation margin set in this way, a plurality of read requests may be received from the host 102 and be gathered in the input buffer 184 (S36). If the third operation margin ends, the pairing operation is performed on the plurality of read requests stored in the input buffer 184 (S38).

For example, it is assumed that, when the memory system 110 transmits read data to the host 102, it takes 10 ms to transmit one read data, the output count reference value OUT COUNT_REF is 8 and the operation margin reference value TIME_REF is 80 ms. If 10 read data to be outputted to the host 102 are stored in the output buffer 186, it may be determined that the number OUT DATA_COUNT of pieces of the read data is greater than or equal to 8 as the output count reference value OUT COUNT_REF. Since there are 10 read data, the memory system 110 may have the first operation margin of 100 ms (=10×10). For example, when assuming that the second operation margin of 5 ms is required to transfer a read request and receive data between the controller 130 and the memory device 150, the controller 130 may additionally gather a plurality of read requests and logical addresses corresponding thereto inputted from the host 102, in the input buffer 184 and may then try a pairing operation, for maximum 95 ms in the first operation margin of 100 ms. It is determined whether the maximum 95 ms is greater than or equal to the operation margin reference value TIME_REF of 80 ms. Since the maximum 95 ms is greater than the operation margin reference value TIME_REF, it is determined that there is a sufficient operation margin, and thereby, the percentage of the third operation margin for additionally gathering a plurality of read requests and logical addresses corresponding thereto inputted from the host 102, in the input buffer 184 may be set to be greater than the percentage of the fourth operation margin for performing the pairing operation.

In the case where the operation margin reference value TIME_REF is 100 ms, since the maximum 95 ms is less than the operation margin reference value TIME_REF, the percentage of the third operation margin for additionally gathering a plurality of read requests and logical addresses corresponding thereto inputted from the host 102, in the input buffer 184 may be set to be less than the percentage of the fourth operation margin for performing the pairing operation.

On the other hand, in the case where the number OUT DATA_COUNT of pieces of read data is less than the output count reference value OUT COUNT_REF, the controller 130 calculates only the fourth operation margin for performing the pairing operation, through the difference between the first operation margin and the second operation margin (S40). During the fourth operation margin, the pairing operation is performed on a plurality of read requests and logical addresses corresponding thereto inputted so far to the input buffer 184 (S42).

For example, it is assumed that, when the memory system 110 transmits data to the host 102, it takes 10 ms to transmit one piece of data and the output count reference value OUT COUNT_REF is 8. If 5 pieces of read data to be outputted to the host 102 are included in the output buffer 186, it may be determined that the number of pieces of read data representing the output count reference value OUT COUNT_REF is less than 8. Since the 5 pieces of read data to be outputted to the host 102 are in the output buffer 186, the first operation margin of the memory system 110 may be 50 ms (=5×10). For example, assuming that the second operation margin of 5 ms is required to transfer a read request and receive data between the controller 130 and the memory device 150, the controller 130 may try the pairing operation on a plurality of read requests and logical addresses corresponding thereto stored so far in the input buffer 184, for maximum 45 ms in the first operation margin of 50 ms.

FIG. 9 is a flow chart illustrating a method for the controller 130 to perform a pairing operation, in accordance with an embodiment of the disclosure. According to an embodiment, the method for performing a pairing operation may be performed by the pairing execution component 194 in the controller 130.

Referring to FIG. 9, the method for performing a pairing operation may include step S50 to step S56. At step S50, the controller 130 may decide whether to try the paring operation, in the case where the number of read requests transferred for pairing is greater than a first threshold value. At step S52, the controller 130 may transfer, without pairing, a transferred read request whose read request priority is less than a second threshold value. At step S54, the controller 130 may perform pairing on transferred read requests. At step S56, the controller 130 may perform no pairing in the case where the number of read requests which have not undergone pairing yet is less than a third threshold value.

The first threshold value, the second threshold value and the third threshold value may be determined based on the number of a plurality of memory dies and the number of a plurality of channels in the memory system 110. In addition, the first threshold value, the second threshold value and the third threshold value may be determined by reflecting the nature of the pairing operation described above with reference to FIGS. 5A and 5B. Furthermore, the first threshold value, the second threshold value and the third threshold value may be adjusted with respect to a pairing success rate.

Referring to FIG. 5A, even though a plurality of read requests are transferred to perform the pairing operation, in the case where the number of the read requests is small, the probability for the read requests to be paired may be small. For example, in the case where the number of channels in the memory system 110 is two, even if the pairing operation is performed on two or three read requests, two read requests may be paired and one read request may not be paired. In the case where none of the three read requests are paired, the input/output throughput of the memory system 110 may be degraded as a result of the time used to attempt the pairing operation. In order to solve this issue, according to an embodiment, the method for performing a pairing operation may decide whether to try the pairing operation, in correspondence to the number of read requests transferred for pairing (S50). The first threshold value may be determined based on the number of channels. For example, the first threshold value may be less than or equal to the number of channels.

Further, even though the number of transferred read requests is greater than the first threshold value and thus the controller 130 performs the pairing operation, if the operation execution component 196 is in an idle state, the input/output throughput of the memory system 110 may be degraded. Therefore, even if a plurality of read requests are transferred, a read request whose read request priority is less than the second threshold value may be transferred to the operation execution component 196, without performing the pairing operation thereon (S52). For example, a case where the pairing operation is performed on 20 read requests is assumed. If the operation execution component 196 is in the idle state, the pairing execution component 194 may transfer a first read request or first and second read requests among the 20 read requests to the operation execution component 196 without performing the pairing operation thereon. According to an embodiment, the second threshold value may be less than or equal to the number of channels in the memory system 110.

The controller 130 may perform pairing on transferred read requests (S54). For example, while the pairing execution component 194 performs the pairing operation on the remaining 19 or 18 read requests, the operation execution component 196 may perform address translation on the first read request or the first and second read requests transferred without undergoing the pairing operation, and may transfer the first read request or the first and second read requests to the plurality of memory dies in the memory device 150. While the operation execution component 196 performs the first read request or the first and second read requests, the pairing execution component 194 may have an operation margin for performing the pairing operation on a plurality of read requests.

The controller 130 may perform no pairing in the case where the number of read requests having not undergone the pairing operation is lower than the third threshold value (S56). For example, it is assumed that three read requests having not undergone the pairing operation remain while the pairing operation is performed on the 18 or 19 read requests. In the case where the pairing execution component 194 is holding the three read requests having not undergone pairing to pair the three read requests with other read requests, the operation execution component 196 may be switched to the idle state. In this case, the input/output throughput of the memory system 110 may be degraded. In the case where the number of read requests having not undergone pairing is less than the third threshold value, the pairing execution component 194 may stop pairing. According to an embodiment, the third threshold value may be greater than the number of channels in the memory system 110 and equal to or less than the number of memory dies.

The controller 130 may store a success rate of the pairing operation (e.g., a rate of paired read requests among transferred read requests). The success rate of the pairing operation may be determined by dividing the number of paired read requests by the number of read requests transferred for pairing. The controller 130 may calculate and store a success rate of the pairing operation. Referring to FIG. 5A, a pairing success rate may be predicted based on the number of read requests transferred for the pairing operation. According to an embodiment, the controller 130 may stop the pairing operation when the pairing success rate is reached by performing the pairing operation. This is because, in this case, even though the controller 130 may transfer paired read requests by performing the pairing operation, overhead incurred due to the pairing operation may affect the input/output throughput of the memory system 110.

Although various embodiments have been illustrated and described, it will be apparent to those skilled in the art that various changes and modifications may be made without departing from the spirit and scope of the invention as defined in the following claims. Thus, the present invention encompasses all changes and variations of any of the disclosed embodiments that fall within the scope of the claims.

What is claimed is:

1. A memory system comprising:
a plurality of memory dies configured to store data; and
a controller coupled with the plurality of memory dies through a plurality of channels,
wherein the controller decides whether to perform a pairing operation, by comparing a number of pieces of read data to be outputted to an external device, which are included in a first buffer, with an output count reference value, and
wherein, in the case where the number of pieces of read data stored in the first buffer is greater than or equal to the output count reference value, the controller gathers a plurality of read requests and logical addresses corresponding thereto in a second buffer, and performs the pairing operation regarding the plurality of read requests.

2. The memory system according to claim 1, wherein the pairing operation includes an operation of matching read requests related with physical locations capable of an interleaving operation, among the plurality of read requests stored in the second buffer, such that the plurality of memory dies can output data corresponding to the plurality of read requests, which are received from the external device, through the plurality of channels in an interleaving scheme.

3. The memory system according to claim 1,
wherein the controller checks the number of pieces of read data to be outputted to the external device from the first buffer, and calculates a first operation margin corresponding thereto, and wherein the controller calculates a second operation margin for transferring a read request to each memory die and receiving data corresponding to the read request.

4. The memory system according to claim 1, wherein the controller does not perform the pairing operation while gathering the plurality of read requests received from the external device, in the second buffer.

5. The memory system according to claim 3, wherein, in the case where the number of pieces of read data stored in the first buffer is greater than or equal to the output count reference value, the controller compares a difference between the first operation margin and the second operation margin with an operation margin reference value, and sets a percentage of a third operation margin for receiving the plurality of read requests and the logical addresses from the external device and gathering the plurality of read requests and the logical addresses in the second buffer and a percentage of a fourth operation margin for performing the pairing operation in correspondence to the plurality of read requests and logical addresses received from the external device.

6. The memory system according to claim 5, wherein, in the case where the difference between the first operation margin and the second operation margin is greater than or equal to the operation margin reference value, the controller sets the percentage of the third operation margin to be greater than the percentage of the fourth operation margin to gather the plurality of read requests and the logical addresses received from the external device in the second buffer and thereafter performs the pairing operation, according to the set percentages of the third operation margin and the fourth operation margin.

7. The memory system according to claim 5, wherein, in the case where the difference between the first operation margin and the second operation margin is less than the operation margin reference value, the controller sets the percentage of the third operation margin to be less than the percentage of the fourth operation margin to gather the plurality of read requests and the logical addresses in the second buffer and thereafter performs the pairing operation, according to the set percentages of the third operation margin and the fourth operation margin.

8. The memory system according to claim 3, wherein, as a result of comparing the number of pieces of read data stored in the first buffer with the output count reference value, in the case where the number of pieces of read data stored in the first buffer is less than the output count reference value, the controller performs the pairing operation in correspondence to logical addresses transferred together with the plurality of read requests, for a fifth operation margin that is determined based on the first operation margin and the second operation margin.

9. The memory system according to claim 1, wherein the controller receives data corresponding to the plurality of read requests on which the pairing operation is performed, in the interleaving scheme through the plurality of channels from the memory dies, stores the data in the first buffer in order, and outputs the data to the external device according to the order in which the data are stored in the first buffer.

10. The memory system according to claim 1, wherein the controller allocates a logical address received from the external device and a physical location in each of the plurality of memory dies based on the number of the plurality of memory dies, in a program operation of storing data in the plurality of memory dies, and performs the pairing operation based on the logical address.

11. A method for operating a memory system including a plurality of memory dies capable of storing data and a controller suitable for performing a pairing operation on at least some among a plurality of read requests, the method comprising:
receiving a plurality of read requests from an external device, and storing the plurality of read requests in an input buffer;
checking a number of pieces of read data to be outputted to the external device, which is stored in an output buffer, to decide whether to perform the pairing operation on the plurality of read requests;
deciding whether to perform the pairing operation on the plurality of read requests, in correspondence to the number of pieces of read data;
performing the pairing operation in correspondence to logical addresses transferred together with the plurality of read requests;
transferring paired read requests to the plurality of memory dies through a plurality of channels, by performing address translation thereon;
receiving data for the paired read requests in an interleaving scheme through the plurality of channels; and
outputting received data to the external device.

12. The method according to claim 11, wherein the pairing operation includes an operation of matching read requests related with physical locations capable of an interleaving operation, among a plurality of read requests stored in the input buffer, such that the plurality of memory dies can output data corresponding to a plurality of read requests, which is received from the external device, through the plurality of channels in an interleaving scheme.

13. The method according to claim 11, wherein the deciding of whether to perform the pairing operation on the plurality of read requests, in correspondence to the number of pieces read data comprises:
comparing the number of pieces of read data and an output count reference value;

deciding, when the number of pieces of read data is greater than or equal to the output count reference value, execution of the pairing operation after receiving a plurality of read requests and logical addresses corresponding thereto on which the pairing operation is to be performed, from the external device and gathering the read requests and the logical addresses in the input buffer; and deciding, when the number of pieces of read data is less than the output count reference value, execution of the pairing operation in correspondence to logical addresses transferred together with the plurality of read requests received from the external device.

14. The method according to claim 11, further comprising:

transferring, when performing the pairing operation, unpaired read requests to the plurality of memory dies after performing address translation sequentially on the unpaired read requests; and receiving data corresponding to the unpaired read requests from the plurality of memory dies.

15. The method according to claim 11, wherein the performing of the pairing operation comprises:

outputting, when the number of read requests transferred for the pairing operation is less than the number of the plurality of memory dies, the read requests without the pairing operation.

16. The method according to claim 11, wherein the performing of the pairing operation comprises:

stopping the pairing operation, when the number of read requests having not undergone the pairing operation during the pairing operation is less than the number of the plurality of memory dies.

17. The method according to claim 13, wherein the receiving of the plurality of read requests and the logical addresses corresponding thereto on which the pairing operation is to be performed, from the external device and the gathering of the read requests and the logical addresses in the input buffer, when the number of pieces of read data is greater than or equal to the output count reference value, comprises:

calculating a first operation margin based on the number of pieces of read data to be outputted to the external device, stored in the output buffer, and a second operation margin for transferring a read request to each memory die and receiving data corresponding to the read request from each memory die;

setting, based on the first operation margin and the second operation margin, a percentage of a third operation margin for receiving the read requests and the logical addresses from the external device and gathering the read requests and the logical addresses in the input buffer and a percentage of a fourth operation margin for performing the pairing operation based on the read requests and the logical addresses inputted from the external device; and performing the pairing operation after gathering the read requests and the logical addresses received from the external device, in the input buffer, according to the percentages of the set third operation margin and fourth operation margin.

18. The method according to claim 17, wherein the setting of the percentage of the third operation margin and the percentage of the fourth operation margin sets the percentage of the third operation margin and the percentage of the fourth operation margin by comparing a difference between the first operation margin and the second operation margin with an operation margin reference value.

19. The method according to claim 18, wherein, as a result of comparing the difference between the first operation margin and the second operation margin with the operation margin reference value, in the case where the difference between the first operation margin and the second operation margin is greater than or equal to the operation margin reference value, the percentage of the third operation margin is set to be greater than the percentage of the fourth operation margin, and in the case where the difference between the first operation margin and the second operation margin is less than the operation margin reference value, the percentage of the third operation margin is set to be less than the percentage of the fourth operation margin.

20. The method according to claim 17, wherein the deciding of, when the number of pieces of the read data is less than the output count reference value, the execution of the pairing operation based on the logical addresses transferred together with the plurality of read requests received from the external device performs the pairing operation by receiving the plurality of read requests and the logical addresses corresponding thereto inputted to the input buffer until a current point of time, for an operation margin calculated by a difference between the first operation margin and the second operation margin.

* * * * *